United States Patent
Scheuerlein et al.

(10) Patent No.: US 6,859,410 B2
(45) Date of Patent: Feb. 22, 2005

(54) TREE DECODER STRUCTURE PARTICULARLY WELL-SUITED TO INTERFACING ARRAY LINES HAVING EXTREMELY SMALL LAYOUT PITCH

(75) Inventors: Roy E. Scheuerlein, Cupertino, CA (US); Matthew P. Crowley, San Jose, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 66 days.

(21) Appl. No.: 10/306,888

(22) Filed: Nov. 27, 2002

(65) Prior Publication Data

US 2004/0100852 A1 May 27, 2004

(51) Int. Cl.[7] .................................................. G11C 8/00
(52) U.S. Cl. ..................... 365/230.06; 365/63
(58) Field of Search .............................. 365/63, 230.06

(56) References Cited

U.S. PATENT DOCUMENTS

| | | | |
|---|---|---|---|
| 4,646,266 A | 2/1987 | Ovshinsky et al. | 365/105 |
| 5,751,012 A | 5/1998 | Wolstenholme et al. | 257/5 |
| 5,835,396 A | 11/1998 | Zhang | 365/51 |
| 5,963,500 A | * 10/1999 | Taura et al. | 365/230.06 |
| 6,034,882 A | 3/2000 | Johnson et al. | 365/103 |
| 6,055,180 A | 4/2000 | Gudesen et al. | 365/175 |
| 6,185,121 B1 | 2/2001 | O'Neill | 365/94 |
| 6,185,122 B1 | 2/2001 | Johnson et al. | 365/94 |
| 6,363,000 B2 | 3/2002 | Perner et al. | 365/66 |
| 6,407,953 B1 | 6/2002 | Cleeves | 365/201 |
| 6,420,215 B1 | 7/2002 | Knall et al. | 438/131 |
| 6,522,594 B1 | 2/2003 | Scheuerlein | 365/206 |
| 6,545,898 B1 | 4/2003 | Scheuerlein | 365/94 |
| 6,567,287 B2 | 5/2003 | Scheuerlein | 365/51 |
| 6,591,394 B2 | 7/2003 | Johnson et al. | 714/766 |
| 6,618,295 B2 | 9/2003 | Scheuerlein | 365/189.09 |
| 6,631,085 B2 | 10/2003 | Scheuerlein et al. | 365/175 |
| 2002/0028541 A1 | 3/2002 | Lee et al. | |
| 2003/0021148 A1 | 1/2003 | Scheuerlein | |
| 2003/0214841 A9 | 11/2003 | Scheuerlein et al. | |
| 2004/0100831 A1 | 5/2004 | Knall et al. | |

OTHER PUBLICATIONS

Naji, Peter K., et al., "A 256kb 3.0V ITIMTJ Nonvolatile Magnetoresistive RAM," 2001 IEEE ISSCC, Feb. 6, 2001, Paper 7.6, and associated slide handouts, 35 pages.

* cited by examiner

Primary Examiner—M. Tran
(74) Attorney, Agent, or Firm—Zagorin, O'Brien & Graham, LLP

(57) ABSTRACT

A tree decoder organization particularly useful for a three-dimensional memory array or any array having very small array line pitch is configured to provide a plurality of top-level decode nodes, each of which, when selected, simultaneously selects a block of array lines and couples each array line of a selected block to a respective intermediate node. Each of the top-level decode signals has a range of control which is substantially less than the extent of the intermediate nodes. In some embodiments each selected block includes more than one array line on each of at least two memory layers having array lines which exit to one side of the memory array. As a result, the large layout area requirement to generate each top-level decode node is supported by a contiguous block of array lines of the memory array.

41 Claims, 10 Drawing Sheets

TREE DECODER STRUCTURE PARTICULARLY WELL-SUITED TO INTERFACING ARRAY LINES HAVING EXTREMELY SMALL LAYOUT PITCH

CROSS-REFERENCE TO RELATED APPLICATION (S)

This application is related to co-pending U.S. application Ser. No. 10/306,887, filed on even date herewith, entitled "Multi-Headed Decoder Structure Utilizing Memory Array Line Driver With Dual Purpose Driver Device" by Roy E. Scheuerlein and Matthew P. Crowley, which application is hereby incorporated by reference in its entirety.

BACKGROUND

The present invention relates to semiconductor integrated circuit containing memory arrays, and particularly those arrays incorporating array lines having extremely small pitch, and more particularly those having a three-dimensional memory array.

Semiconductor integrated circuits have progressively reduced their feature linewidths into the deep sub-micron regime. Moreover, recent developments in certain memory cell technologies have resulted in word lines and bit line having an extremely small pitch. For example, certain passive element memory cell arrays may be fabricated having word lines approaching the minimum feature size (F) and minimum feature spacing for the particular word line interconnect layer, and also having bit lines approaching the minimum feature width and minimum feature spacing for the particular bit line interconnect layer. Moreover, three-dimensional memory arrays having more than one plane of memory cells have been fabricated implanting such so-called $4F^2$ memory cells on each memory plane. Exemplary three-dimensional memory arrays are described in U.S. Pat. No. 6,034,882 to Johnson, entitled "Vertically Stacked Field Programmable Nonvolatile Memory and Method of Fabrication."

However, the area required for implementing decoder circuits for word lines and bit lines has not achieved such dramatic reductions. Consequently, interfacing the word line decoders and bit line decoders to such tightly spaced word lines and bit lines within such very dense arrays has become extremely difficult, and limits the density of memory arrays otherwise achievable. There remains a continued need for improved decoder structures capable of interfacing with large numbers of array lines having a very small pitch, and particularly if such array lines exist on more than one layer, as in a three-dimensional memory array having more than one plane of memory cells.

SUMMARY

An improved tree decoder organization particularly useful for a three-dimensional memory array or any array having very small array line pitch is configured to provide a plurality of top-level decode nodes, each of which, when selected, simultaneously selects a block of array lines and couples each array line of a selected block to a respective intermediate node. Each of the top-level decode signals has a range of control which is substantially less than the extent of the intermediate nodes. In some embodiments each selected block includes more than one array line on each of at least two memory layers having array lines which exit to one side of the memory array. As a result, the large layout area requirement to generate each top-level decode node is supported by a contiguous block of array lines of the memory array.

In some embodiments, an integrated circuit includes a memory sub-array having a plurality of array lines on at least one layer of the memory sub-array, at least some of the array lines exiting to one side of the memory sub-array. A tree decoder circuit is associated with the memory sub-array, and includes a top level of the tree decoder which is responsive to a plurality of top-level control signals, and includes at least a second level responsive to a plurality of second-level control signals. The tree decoder further includes a plurality of intermediate nodes between the top-level and second level each extending along the one side of the sub-array. Each of the plurality of top-level control signals has a range of control which is substantially less than the extent of each intermediate node.

In some embodiments, the memory sub-array may be a three-dimensional memory sub-array including at least two layers of array lines having at least some array lines exiting to the one side of the memory sub-array. Each of the plurality of top-level signals may select a respective group of array lines, each respective array line of a group being coupled to a respective one of the plurality of intermediate nodes. In some embodiments, unselected top-level signals couple each respective array line of each unselected group to an associated unselected bias node. In some embodiments, each of the plurality of second-level signals selects a respective group of at least one of the plurality of intermediate nodes and, when unselected, couples its respective intermediate node to an associated unselected bias node, thereby coupling array lines that are coupled to the respective intermediate node a selected top-level signal, to the associated unselected bias node.

In some embodiments, an integrated circuit includes a first tree decoder serving array lines exiting to one side of a three dimensional memory array. Each respective one of a plurality of top level decode nodes is coupled to a respective plurality of sixteen array line coupling circuits which are arranged, when their associated top-level decode node is selected, to couple four adjacent array lines on each of four layers to a respective intermediate node of the first multi level decoder circuit. Each respective one of a plurality of second-level decode nodes is coupled to a respective plurality of intermediate node coupling circuits which are arranged, when their associated second-level decode node is selected, to couple each of the four intermediate nodes corresponding to a selected layer, to a respective output node.

BRIEF DESCRIPTION OF THE DRAWINGS

The present invention may be better understood, and its numerous objects, features, and advantages made apparent to those skilled in the art by referencing the accompanying drawings.

FIG. 3, labeled prior art, and comprising

The use of the same reference symbols in different drawings indicates similar or identical items.

DETAILED DESCRIPTION

Figure 1:
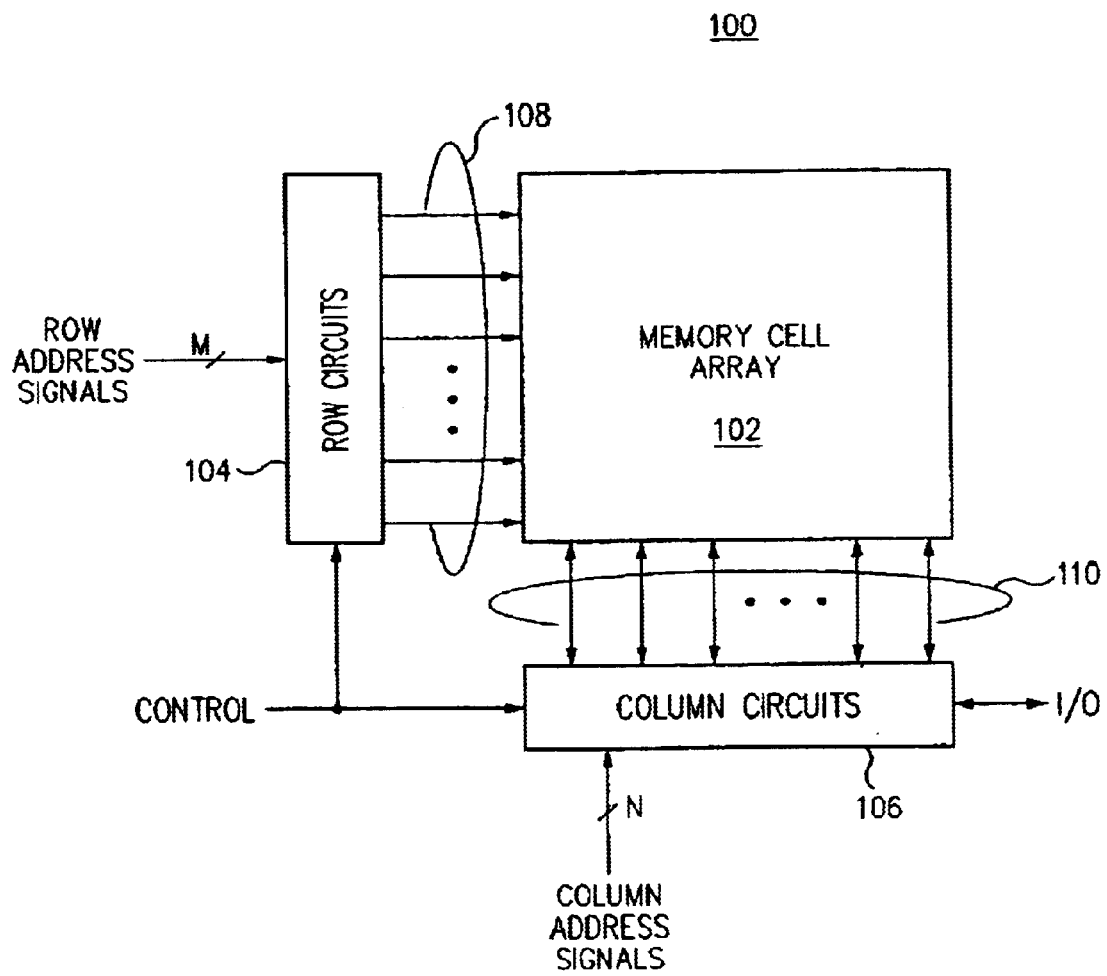
FIG. 1, labeled prior art, is a block diagram of a memory array and supporting row and column circuits.

Referring now to FIG. 1, a block diagram is shown of an integrated circuit 100 including a memory array 102. In one embodiment of the invention, the memory array 102 is preferably a three-dimensional, nonvolatile, field-programmable write-once memory array of passive element memory cells, although other memory arrays are also suitable and specifically contemplated. As used herein, an integrated circuit having a three-dimensional memory array is assumed to be a monolithic integrated circuit, rather than an assembly of more than one monolithic integrated circuit. Each passive element memory cell within the memory array 102 is preferably a two-terminal memory cell having a steering element in series with a state change element, together connected between usually orthogonal (but not necessarily so) array terminal lines. These two elements within a memory cell may both be present before programming. Alternatively, the steering element within a given memory cell may be formed during programming of the memory cell. Suitable state change elements include those having a significant change of resistance, including both fuses and antifuses. A memory cell whose state change element is an antifuse may be termed an antifuse memory cell, whereas a memory cell whose state change element is a fuse may be termed a fuse memory cell.

The array terminal lines (also called array lines) at one layer may be termed word lines or X-lines. The array lines at a vertically adjacent layer may be termed bit lines or Y-lines. A memory cell is formed at the projected intersection of each word line and each bit line, and is connected between the respective intersecting word line and bit line. A three-dimensional memory array which has at least two levels of memory cells may utilize at least more than one layer of word lines or more than one layer of bit lines. A group of word lines, each residing on a separate layer and substantially vertically-aligned (notwithstanding small lateral offsets on some layers), may be collectively termed a row. The word lines within a row preferably share at least a portion of the row address. Similarly, a group of bit lines, each residing on a separate layer and substantially vertically-aligned (again, notwithstanding small lateral offsets on some layers), may be collectively termed a column. The bit lines within a column preferably share at least a portion of the column address.

The array terminal lines of memory array 102 include the various layer(s) of word lines organized as rows, and the various layer(s) of bit lines organized as columns. The integrated circuit 100 includes a row circuits block 104 whose outputs 108 are connected to respective word lines of the memory array 102. The row circuits block 104 receives a group of M row address signals and one or more various control signals, and typically may include such circuits as row decoders and array terminal drivers for both read and write (i.e., programming) operations. The integrated circuit 100 also includes a column circuits block 106 whose input/outputs 10 are connected to respective bit lines of the memory array 102. The column circuits block 106 receives a group of N column address signals and one or more various control signals, and typically may include such circuits as column decoders, array terminal receivers, read/write circuitry, and I/O multiplexers. Circuits such as the row circuits block 104 and the column circuits block 106 may be collectively termed array terminal circuits for their connection to the various terminals of the memory array 102.

Integrated circuits incorporating a memory array usually subdivide the array into a sometimes large number of sub-arrays. As frequently used, a sub-array is a contiguous group of memory cells having contiguous word and bit lines generally unbroken by decoders, drivers, sense amplifiers, and input/output circuits. This is done for any of a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. Nonetheless, for ease of description, an array may also be used synonymously with sub-array to refer to a contiguous group of memory cells having contiguous word and bit lines generally unbroken by decoders, drivers, sense amplifiers, and input/output circuits. As used herein, an integrated circuit may include one or more than one memory array.

Figure 2:
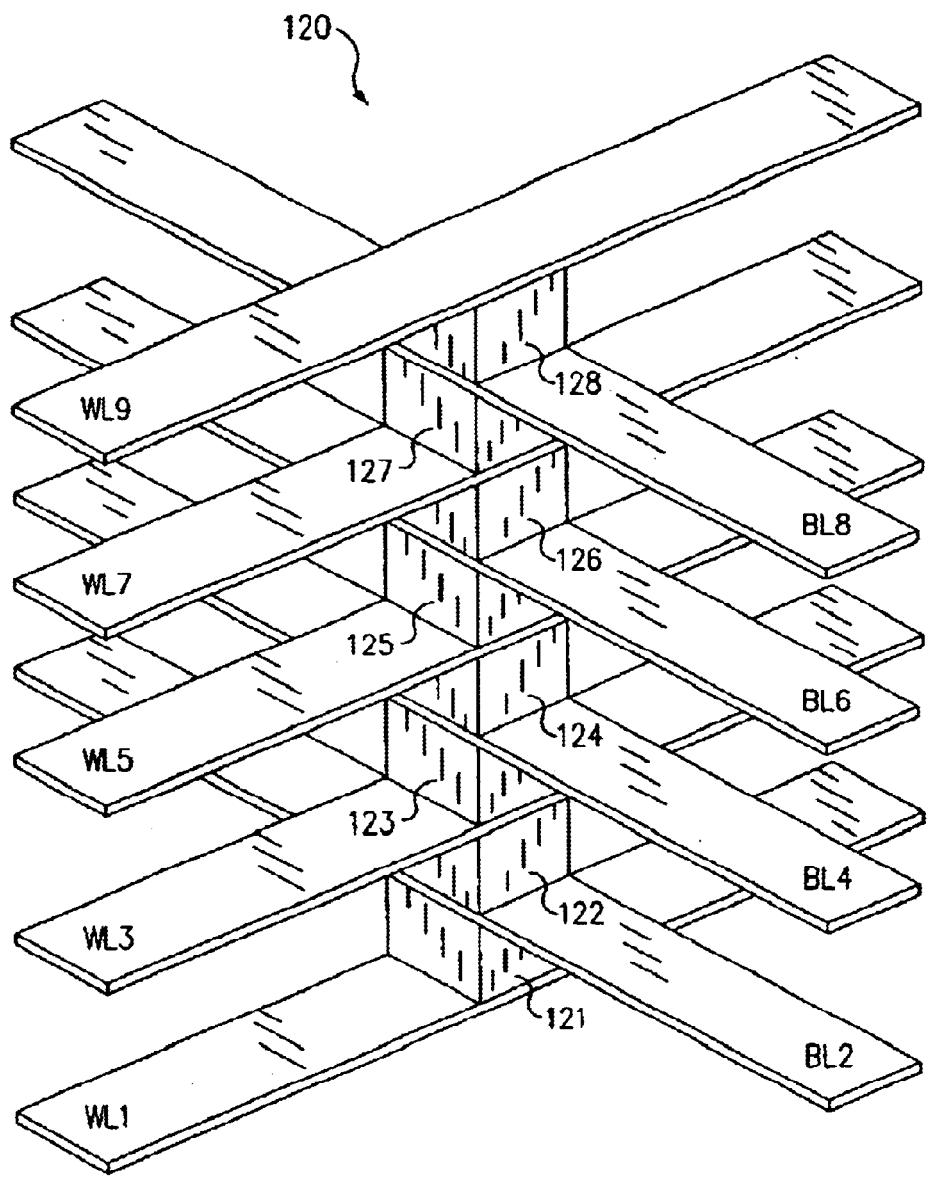
FIG. 2, labeled prior art, is a perspective view depicting an exemplary three-dimensional memory array.

FIG. 2 depicts an exemplary three-dimensional memory array 120 which incorporates passive element memory cells formed between vertically adjacent word lines and bit lines. Five word lines layers WL1, WL3, WL5, WL7, and WL9 are shown, and four bit line layers BL2, BL4, BL6, and BL8 are shown. A memory cell is formed at the projected intersection of each word line and bit line. For example, memory cell 123 is formed between word line WL3 and bit line BL4. Eight memory cells 121, 122, 123, 124, 125, 126, 127, and 128 are shown. As can be appreciated, a given bit line such as BL4 has a memory cell 124 formed above the bit line BL4, and another memory cell 123 formed below the bit line BL4, both of which are connected to the bit line BL4.

An advantageous passive element memory cell is a structure combining an antifuse and a diode in series as the memory cell. Suitable memory cells are described in U.S. Pat. No. 6,034,882 entitled "Vertically Stacked Field Programmable Nonvolatile Memory and Method of Fabrication" Particularly suitable memory cells are also described in U.S. Pat. No. 6,420,215 in which for an exemplary embodiment, a multi level memory array is formed of a first plurality of spaced apart rail stacks disposed at a first height and/or a first direction above a substrate, and a second plurality of spaced apart rail stacks disposed above the first plurality of rail stacks and run in a second direction different than the first direction An insulating layer is formed between the first rail stack and the conductor of the second rail stack which is capable of being selectively breached by passing a current. Other advantageous memory cell arrays are described in U.S. patent application Ser. No. 09/897,705 entitled "Three-Dimensional Memory Array Incorporating Serial Chain Diode Stack" filed on Jun. 29, 2001, and U.S. patent application Ser. No. 09/560,626 entitled "Three-Dimensional Memory Array and Method of Fabrication" filed on Apr. 28, 2000, both of which are hereby incorporated by reference in their entirety.

Figure 3A:
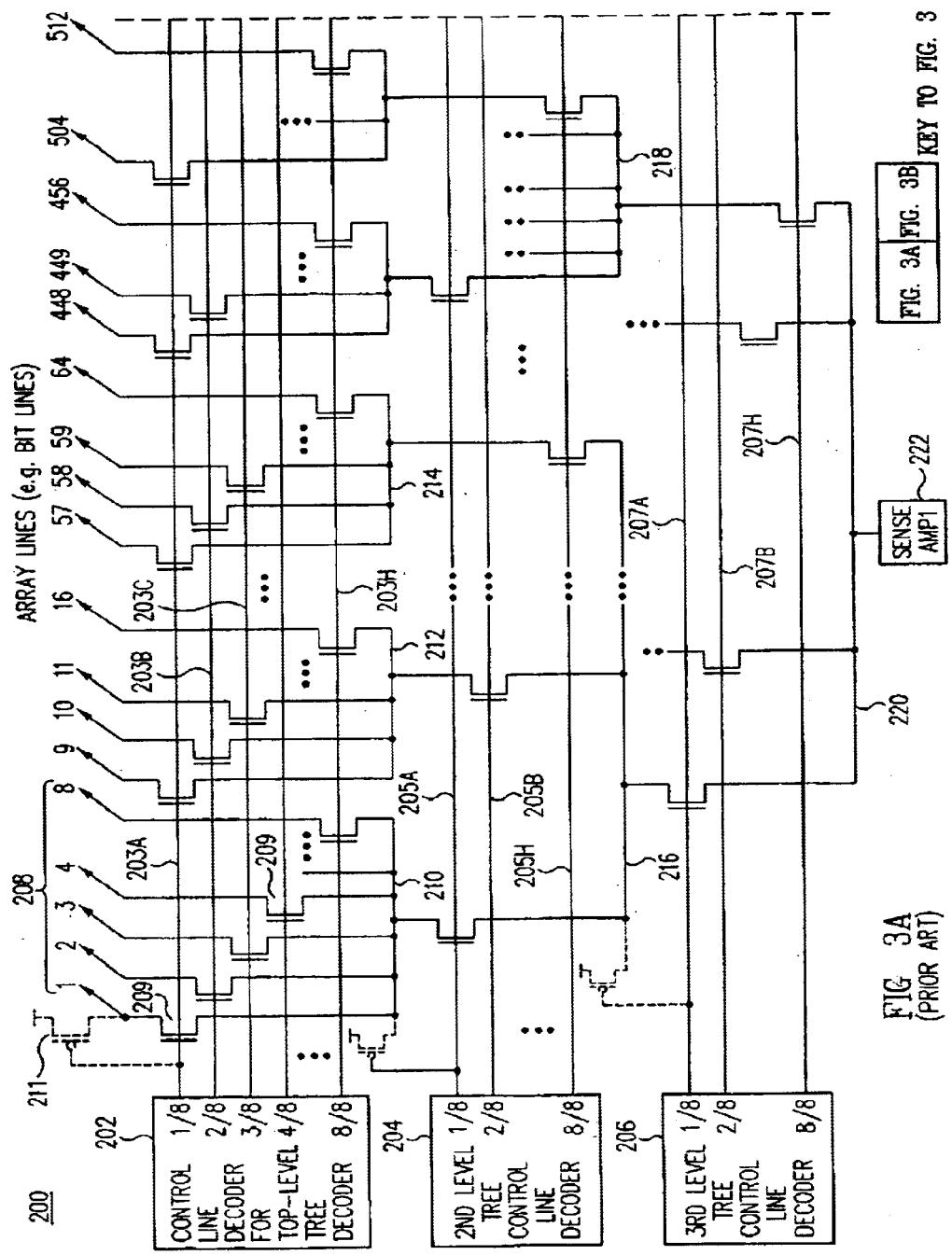
FIG. 3A and FIG. 3B, is an electrical schematic diagram representing a traditional tree decoder circuit.
Figure 3B:
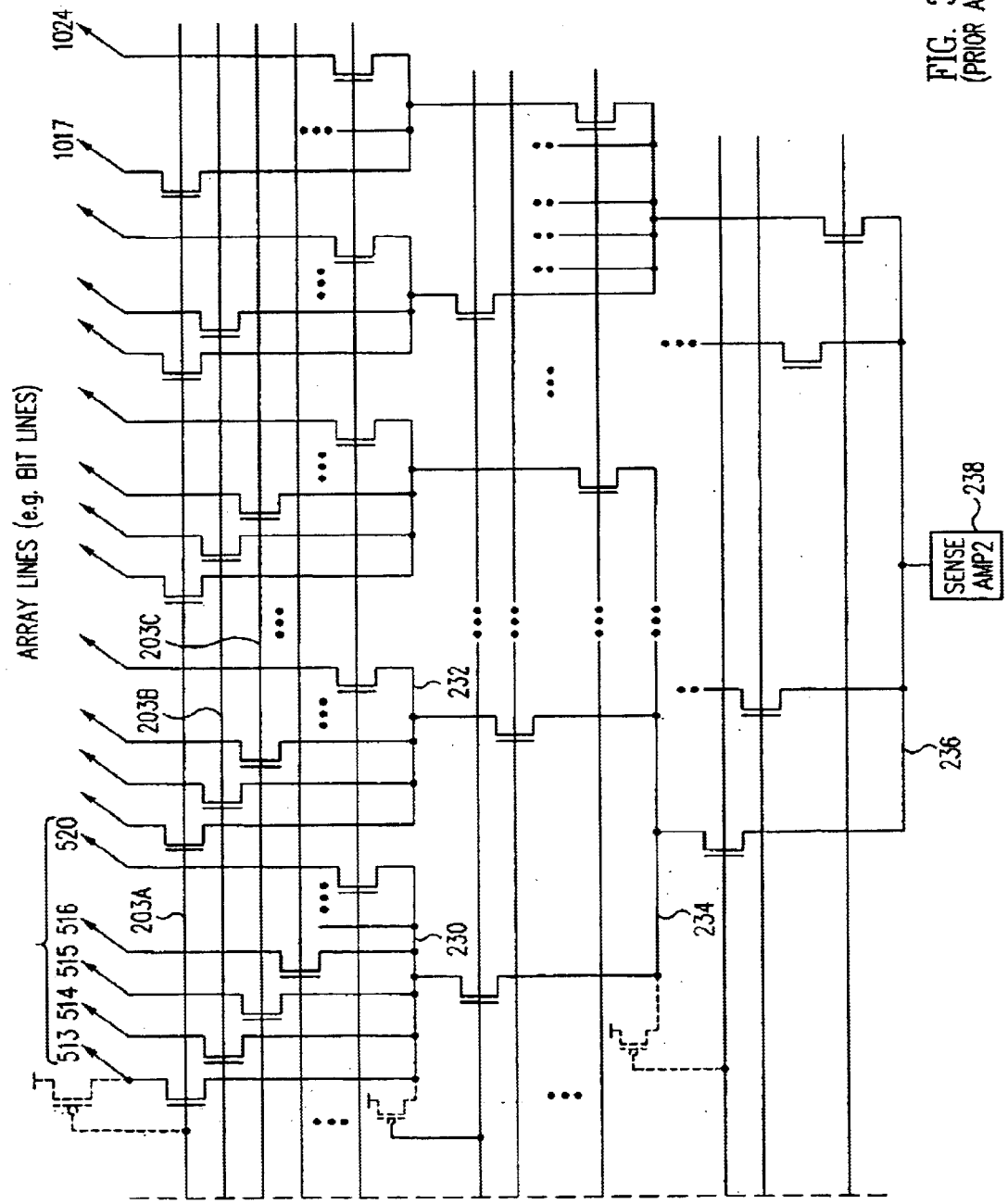

FIG. 3 depicts a traditional tree decoder circuit 200 as might be incorporated within the column circuits block 106. A group of 1024 array lines are shown, here representing bit lines of the memory array. As depicted the tree decoder 200 has three levels, each level being driven by a respective group of decode lines or control lines. For example, a top-level control line decoder 202 receives a group of column related address signals (not shown) and generates eight decoded output signals 203A, 203B, . . . , 203H, one of which (at most) is selected (i.e., driven to an active level) and the remaining seven such signals are unselected or inactive. The selected decode signal couples a selected array line, of the eight possible array lines (e.g., a group collectively labeled 208) to an intermediate node 210. The same selected decode signal couples a selected one of a respective group of eight array lines to each respective intermediate node 212, . . . , 214, for all array lines extending along the side of the memory array.

Another control line decoder 204 also receives a group of column related address signals (not shown) and generates eight decoded output signals 205A, 205B, . . . , 205H, the selected one of which couples a selected intermediate node from a group of such intermediate nodes 210, 212, . . . , 214, to a lower-level intermediate node 216. Lastly, another control line decoder 206 also receives a group of column related address signals (not shown) and generates eight decoded output signals 207A, 207B, . . . , 207H, the selected one of which couples a selected intermediate node from a group of such intermediate nodes 216, . . . , 218, to a decoder output node 220, which is coupled to an input of a sense amplifier circuit 222.

In such a traditional decoder circuit 200, the various intermediate nodes are usually kept as small as possible to reduce the capacitive loading of such intermediate nodes. In the decoder circuit shown, each level of the tree has a fanout of 8, meaning each intermediate node has only eight selection (i.e., steering) devices "above" the intermediate node, and one selection device "below" the intermediate node. For example, the group of array lines 208 are frequently arranged to be physically close in proximity to each other, and frequently may be adjacent to each other, in order to keep the length of the intermediate node 210 as short as possible. In other words, the length of the intermediate node 210 corresponds to the pitch of eight array lines, and thus the "extent" of the intermediate node 210 is eight array lines.

In contrast, the eight decoded output signals 203A, 203B, . . . , 203H extend all the way across the width of the memory array (i.e., the "length" of the column decoder along one side of the memory array). One such array line is selected from each group of eight array lines. Consequently, the "range of control" of the control signals for the top-level tree decoder is substantially the entire width of the memory array.

Figure 4:
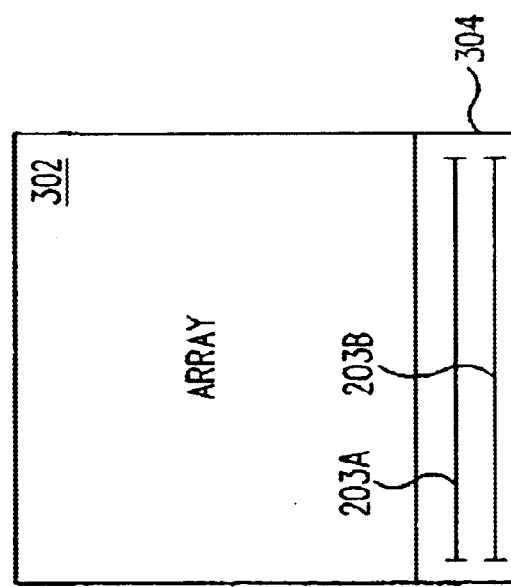
FIG. 4 is a block diagram representing a characteristic of the tree decoder shown in FIG. 3.

Referring briefly to FIG. 4, a block diagram representation of this arrangement is depicted. Here a memory array 302 is shown, along with top-level decoder 304. The range of control of each of the top-level decode lines is represented by lines 203A, 203B, and which correspond to the physical length of such signal lines as shown in FIG. 3. The extent of the intermediate nodes between the top-level and the next lower level of the tree decoder, such as intermediate nodes 210, 212, are also depicted. As can be easily perceived, the range of control of the control signals for the top-level tree decoder is substantially the entire width of the memory array, and is much larger than the extent of each intermediate node just below the top-level of the tree decoder.

Figure 5:
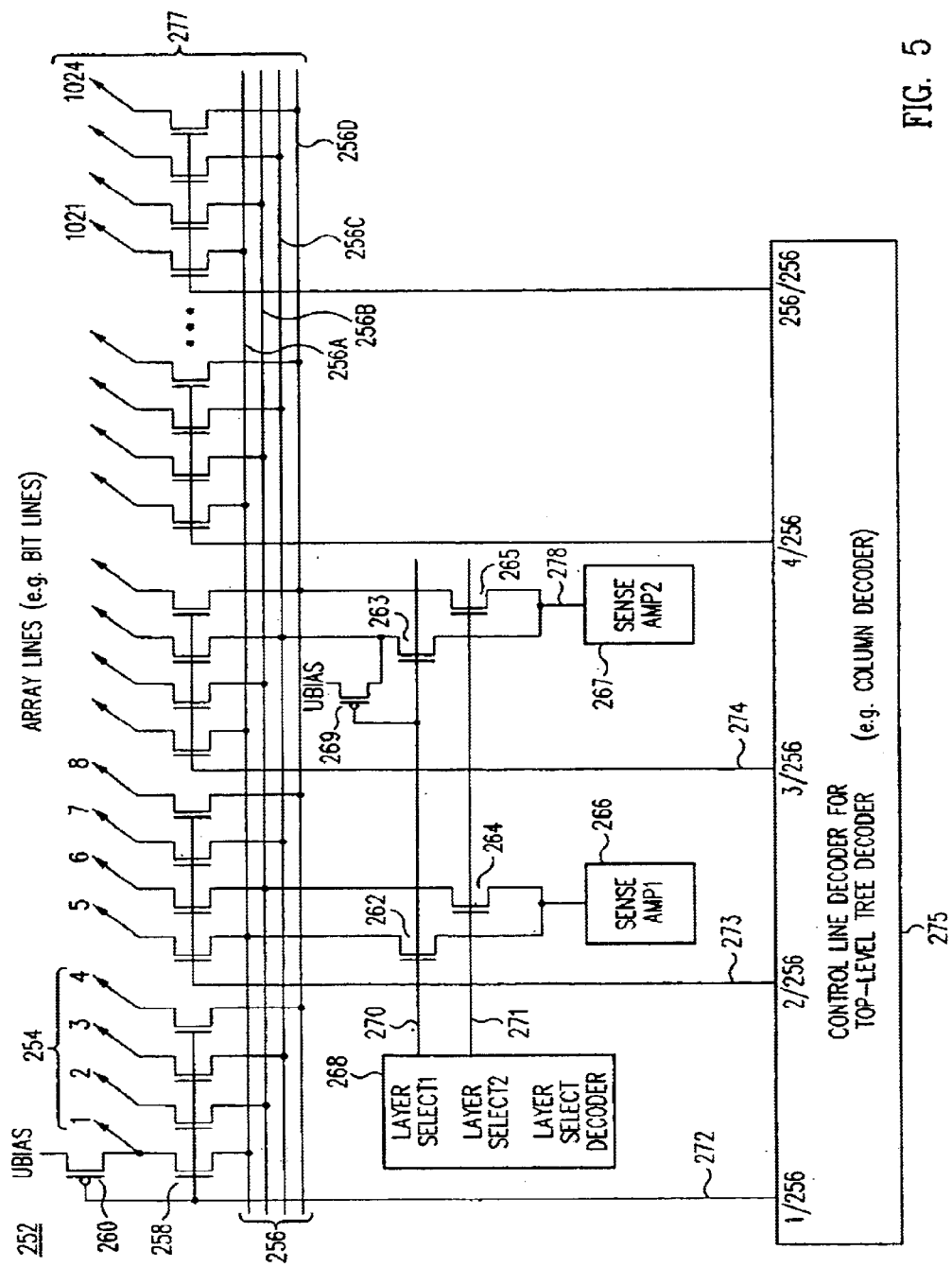
FIG. 5 is an electrical schematic diagram of a multi level decoder circuit in accordance with the present invention.

Referring now to FIG. 5, an improved decoder 252 in accordance with the present invention is depicted, which is particularly beneficial for three-dimensional memory arrays (i.e., having more than one plane of memory cells). A group of 1024 array lines is again shown, here representing bit lines of the memory array. As depicted the decoder 252 may be viewed as a two-level tree decoder, or alternatively as a multi-level decoder circuit. The top-level control lines are decoded outputs of column decoder 275, which receives a group of column related address signals (not shown) and generates a 1-of-256 decode on its outputs (several of which are labeled 272, 273, 274), one of which (at most) is selected (i.e., driven to an active level) and the remaining ones are unselected. Each column decoder output signal (e.g., 272) couples four array lines respectively to four intermediate nodes 256A, 256B, 256C, and 256D within the top-level 277 (i.e., nearest the memory array) of the multi level decoder circuit.

A layer select decoder 268 also receives a group of column related address signals (not shown) and generates two decoded output signals 270, 271, the selected one of which couples either intermediate node 256A or 256B through transistors 262 or 264 to the input of a first sense amplifier 266, and couples either intermediate node 256C or 256D through transistors 263 or 265 to a decoder output node 278, which is coupled to the input of a second sense amplifier 267. Note that there is no sense amplifier circuit either directly coupled to each array line, or directly coupled to each intermediate node. The nearest sense amplifier circuit to a given array line is found at the output node of the multi-level tree decoder circuit. Moreover, as used herein, a tree decoder circuit utilizes at least two levels of decoding for array lines within a single sub-array of a larger array within an integrated circuit. Additional levels of decoding, such as utilizing various I/O lines, may be employed to further decode and route signals from some or all sub-arrays to a desired destination, either on-chip or off-chip.

In the top level decoder portion 277, unselected bias transistors (one of which, transistor 260, being shown) may be included within each array line coupling circuit to provide an unselected bias voltage on the associated array line when unselected. The particular bias voltage to which each unselected bias transistor 260 is coupled may be different for each layer of the memory array, as described in greater detail herebelow.

In this exemplary decoder circuit 252, the intermediate nodes 256 extend all the way across the width of the memory array (i.e., the "length" of the column decoder along one side of the memory array). This is in stark contrast to the traditional tree decoder 200 described above, in which the intermediate nodes are usually kept as small as possible to reduce the capacitive loading of such intermediate nodes. In the decoder circuit 252 shown, the top level of the decoder has a fanout of 256. In other words, each intermediate node within the top level has two-hundred fifty-six selection devices (i.e., steering devices) connected "above" the intermediate node, and one selection device connected "below" the intermediate node. For example, the group of array lines 254 may be assumed to be arranged in close physical proximity to each other, and may be adjacent to each other.

However, each of the four array lines of the group 254 is coupled to a different intermediate node. This allows the same decode node (e.g., 272) to be used for each of the array line coupling devices, and helps the decoder circuit to achieve a pitch as small as the array itself Hence, the "range of control" of the decode nodes (e.g., 272) is two array lines (assuming, as shown, that only 2 of the 4 selected array lines are on the same layer).

Figure 6:
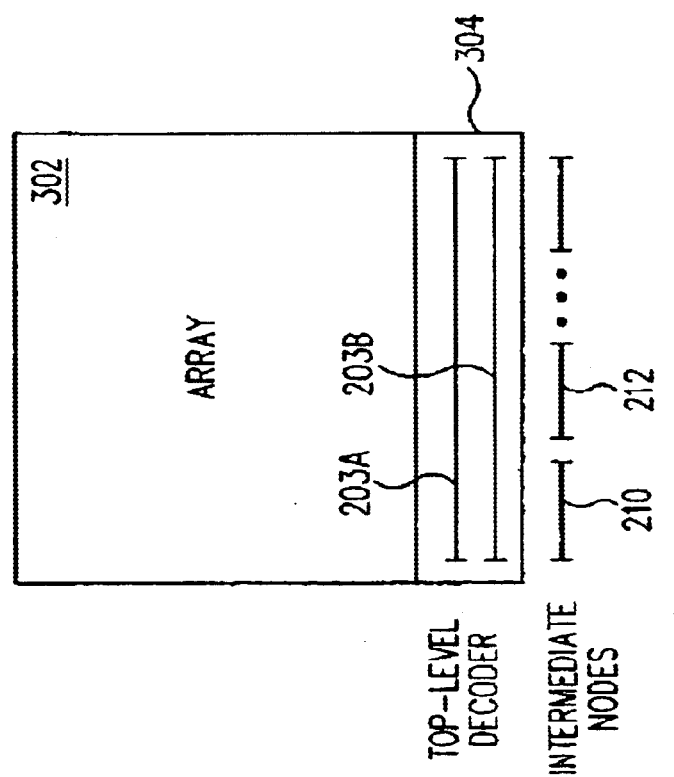
FIG. 6 is a block diagram representing a characteristic of the multi level decoder shown in FIG. 5.

Referring now to FIG. 6, a block diagram representation of this organization is depicted. Here a memory array 312 is shown, along with top-level decoder 277. The range of control of each of the top-level decode lines is represented by lines 272, 273, 274, and which correspond to the total width of the array lines (on a particular layer) associated with such signal lines as shown in FIG. 5. The extent of the intermediate nodes between the top-level and the next lower level of the decoder, intermediate nodes 256, is also depicted, which extent is substantially the entire width of the memory array. In this organization, the range of control of the control signals for the top-level tree decoder is much smaller than the extent of each intermediate node just below the top-level of the decoder.

Figure 7:
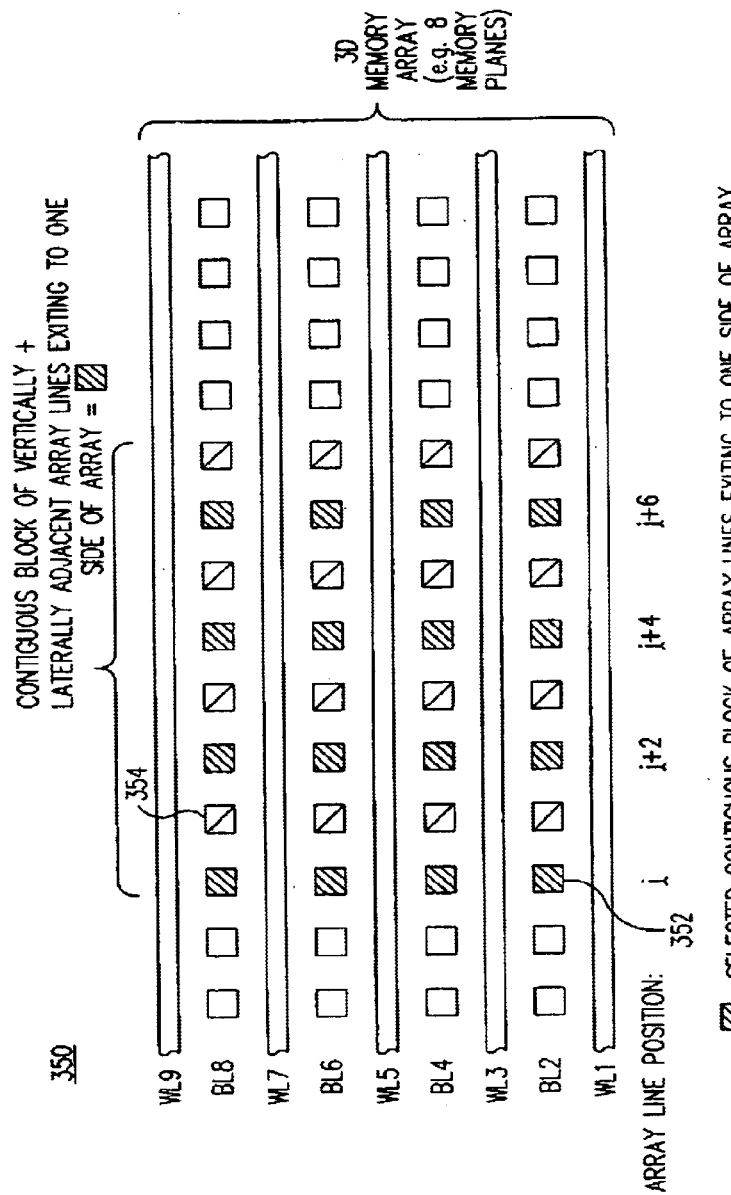
FIG. 7 is a cross-sectional diagram depicting a contiguous block of array lines as simultaneously selected by a decoder circuit in accordance with the present invention.

The above FIG. 5 depicts an organization in which each column decode signal couples two array lines on each of two layers of a memory array to respective intermediate lines of the decoder. A layer decoder then couples the two array lines from the selected layer to respective sense amplifier circuits. This organization may be easily extended to one in which four array lines are simultaneously selected on each of four memory array layers by a single column decoder output, and coupled to a respective one of sixteen intermediate nodes running substantially across the entire width of the memory array. The array lines on each layer may be shared by a memory plane above the layer and by another memory plane below the layer. FIG. 7 depicts a cross sectional representation of a three-dimensional memory array having eight memory planes (i.e., memory levels), each formed vertically between a word line layer (e.g., WL1, WL3, WL5, WL7, WL9) and an adjacent bit line layer (e.g., BL2, BL4, BL6, BL8), as described hereinabove. The array lines on each layer are preferably inter-digitated, with every other array line exiting to one side of the array, and the remaining half of the array lines exiting the array to the side opposite the one side. For example, bit lines i, i+2, i+4, and i+6 on each of the BL2, BL4, BL6, BL8 layers exit to one side of the array. This group of sixteen array lines, representing a contiguous block of vertically and laterally adjacent array lines of those array lines exiting to one side of the array, are preferably simultaneously selected by a selected column decode signal and each respectively coupled to a respective intermediate node. Similarly, bit lines i+1, i+3, i+5, and i+7 on each of the BL2, BL4, BL6, BL8 layers exit to the other side of the array. This additional group of sixteen array lines, representing another contiguous block of vertically and laterally adjacent array lines of those array lines exiting to the other side of the array, are simultaneously selected by a selected column decode signal and each respectively coupled to a respective intermediate node running along the other side of the array.

Figure 8:
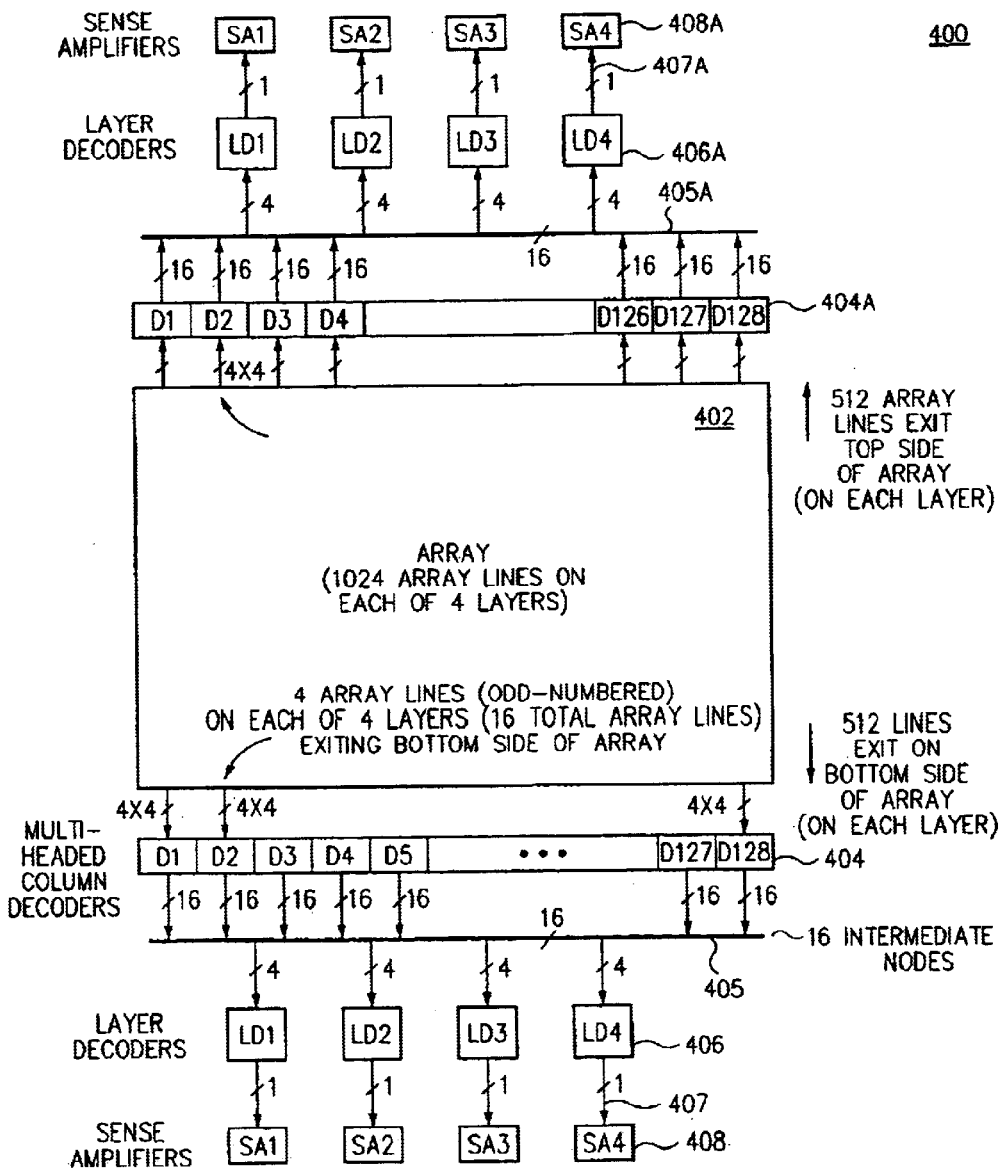
FIG. 8 is a block diagram depicting an integrated circuit having a memory array organization in accordance with the present invention.

A block diagram view of such an organization is depicted in FIG. 8. Memory array 402 includes 8 memory planes which are served by 1024 array lines (here shown as bit lines) on each of 4 layers. (The word line circuits are not shown.) Half of the bit lines exit to the top of the array, and the other half exit to the bottom of the array. Along the bottom of the array 402, a column circuit is shown which includes a group of multi-headed column decoders 404, each of which includes 16 "heads" which are arranged to couple each of 16 array lines to a respective one of a group of 16 intermediate nodes 405. In the exemplary organization shown, 128 column decode circuits provide a 1-of-128 decode, each one of which when selected, couples its 16 associated array lines to the 16 intermediate nodes 405. Each selected group of 16 array lines are preferably arranged in a contiguous block of vertically and laterally adjacent array lines exiting to one side of the array, as depicted in FIG. 7 above.

Four layer decoder circuits 406 are also shown, each receiving four of the sixteen intermediate nodes, representing a selected array line on each of the four layers. One of the layers is selected by address signals (not shown), and the layer decoders 406 each couple the respective intermediate node 405 corresponding to the selected layer to its output node 407, which is coupled to the input of an associated sense amplifier circuit 408. Each of the sense amplifiers may generate an output simultaneously, or alternatively further decoding may be utilized to select less than all of them.

Along the top of the array 402, a column circuit is shown which includes a group of multi-headed column decoders 404A, each of which includes 16 "heads" or "coupling circuits" (also sometimes referred to herein as selector/driver circuits) which are arranged to couple each of 16 array lines to a respective one of a group of 16 intermediate nodes 405A. The selected one of the 128 column decode circuits 404A couples its 16 associated array lines to the 16 intermediate nodes 405A. As before, a selected group of 16 array lines is preferably arranged in a contiguous block of vertically and laterally adjacent array lines exiting to the top side of the array, as depicted in FIG. 7 above. Four layer decoder circuits 406A are also shown, each receiving four of the sixteen intermediate nodes, and which represent a selected array line on each of the four layers. One of the layers is selected by address signals (not shown), and the layer decoders 406A each couple the respective intermediate node 405A corresponding to the selected layer to its output node 407A, which is coupled to the input of an associated sense amplifier circuit 408A.

As depicted in the exemplary organization, four array lines are simultaneously selected of the 512 array lines exiting to the bottom of the array, and four additional array lines are simultaneously selected of the 512 array lines exiting to the top of the array. Each of these eight selected array lines is coupled to the input of an associated sense amplifier circuit, four of which are "above" of the array (i.e., located to one side of the array), and four "below" the array. Each of these eight sense amplifiers may generate an output simultaneously, giving rise to an 8-bit byte of information simultaneously available from the array. Alternatively further decoding may be utilized to select less than all of them. For example, some of the sense amplifier outputs may be utilized, and the others ignored, such as in an organization which scatters the various bits from a large word into a large number of memory arrays, such as might be desirable when using Error Checking and Correction (ECC) techniques. Advantageous organizations employing ECC are described in co-pending U.S. application Ser. No. 09/747,574 entitled "Three-Dimensional Memory Array and Method for Storing Data Bits and ECC bits Therein," filed Dec. 22, 2000, which application is published on Jun. 27, 2002 as U.S. patent application Ser. No. 20020083390 A1.

Figure 9:
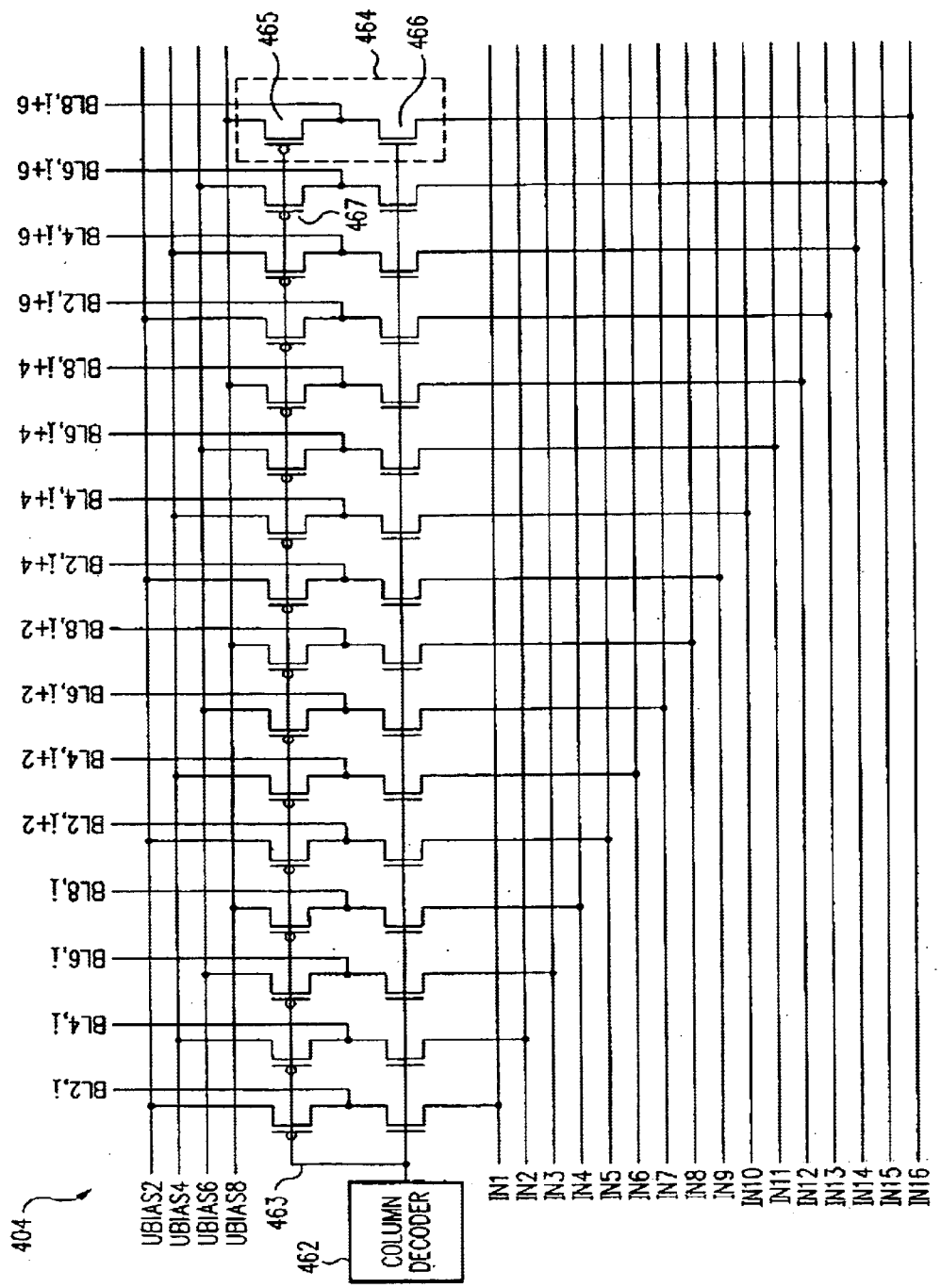
FIG. 9 is an electrical schematic diagram of a portion of a multi-level decoder circuit in accordance with the present invention.

Referring now to FIG. 9, a detailed schematic diagram of an exemplary multi headed column decoder circuit 404 is shown, as might be used in the above described FIG. 8. A column decoder 462 is shown, which receives column address information (not shown) and generates a column decode output signal on decode node 463. This decoded output 463 is coupled to the input of sixteen "heads", such the one labeled 464. Each such head preferably includes a P-channel transistor 465 which couples the associated array line to an unselected bias node, such as UBIAS8, when the decoded output 463 is unselected, and which couples the associated array line to an associated one of the sixteen intermediate nodes, such as IN16, when the decoded output 463 is selected (i.e., active). Four different unselected bias nodes are provided, one for each layer of the memory array. In this way, unselected array lines on each layer may be biased or left floating independently of unselected array lines on other layers, the desirability of which is described more fully in co-pending U.S. application Ser. No. 09/897,771, entitled "Method and Apparatus for Biasing Selected and Unselected Array Lines When Writing a Memory Array", by Roy E. Scheucrlein, filed Jun. 29, 2001, which application is published on Sep. 26, 2002 as U.S. patent application Ser. No. 20020136047 A1. As described in this referenced application, such unselected bias nodes may be advantageously generated by a group of four unselected bias generator circuits, one associated with each layer. Each such unselected bias generator circuit receives address signals which are used to decode the selected memory plane (i.e., the selected array line layer) to generate bias voltages or conditions appropriately. Furthermore, in a programmable device, additional signals may be received which communicate the mode of operation to the unselected bias generator circuits. For example, the unselected bit line bias voltage may likely be different for read mode than for write mode, and the multi-headed decoder circuit shown in FIG. 9 may be effectively used in either mode of operation. Moreover, by generating four such unselected bias nodes by a group of four unselected bias generator circuits, one associated with each layer, the particular bias voltage applied to a given layer may be more optimally adjusted for the given layer, or adjusted for a given memory level, as described more fully in co-pending U.S. application Ser. No. 10/306,887, entitled "Integrated Circuit and Method for Selecting a Set of Memory-Cell-Layer-Dependent or Temperature-Dependent Operating Conditions", filed on even date herewith, which application is hereby incorporated by reference.

In preferred embodiments of the invention each array line selector/driver circuit (i.e., array line decoder "head") preferably includes two transistors. One transistor may be used to apply a bias potential to unselected array lines, and the other transistor used to couple a selected array line to another "downstream" node, such as the intermediate nodes described herein. Nonetheless, other configurations are contemplated for the heads. For example, N-channel transistors may be exclusively used if the various bias conditions lend themselves to such use. Moreover, additional transistors may be employed to accomplish additional functions if layout area permits. Moreover, such multi-headed decoder circuits are also useful in memory arrays having only one plane of memory cells, although the layout density advantages of such decoders are even more beneficial in three-dimensional arrays having more than one memory plane, as the effective density of array lines is potentially even more dense, especially when $4F^2$ memory cells are employed.

A variety of suitable column decoder circuits 462 (also shown as column decoder 275 in FIG. 5) may be employed, an exemplary one of which may include a plurality of pre-decoders driving a plurality of decoder/drivers. The pre-decoders may be arranged to pre-decode at least two groups of addresses and generate a number of pre-decoded lines, which are conveyed to a plurality of column decoder circuits. Each column decoder circuit may include a level translator and driver configured to generate suitable bias voltages for reading (at times) and writing (at other times) passive element memory cells. Such circuits are described in greater detail, in the context of a word line decoder application but equally applicable to column decoder applications, in the aforementioned "Three-Dimensional Memory Array Incorporating Serial Chain Diode Stack," application Ser. No. 09/897,705, and further described in "Memory Device with Row and Column Decoder Circuits Arranged in a Checkerboard Pattern under a Plurality of Memory Arrays," application Ser. No. 09/896,814, filed on Jun. 29, 2001, which published on Sep. 26, 2002 as U.S. patent application Ser. No. 20020136045 A1.

It should be appreciated that the schematic of FIG. 9 does not necessarily imply any physical arrangement for the sixteen array lines associated therewith. For example, transistor 465 may not be physically adjacent to transistor 467, but rather may be quite some distance apart. Moreover, transistor 464 and transistor 465 may be located some distance from each other. Rather, the schematic represented by FIG. 9 is meant to illustrate that a contiguous block of 4 adjacent array lines exiting the array to one side, on each of 4 layers of the memory array, are decoded by the same top-level decode signal and coupled onto a respective one of 16 intermediate nodes IN1, IN2, ..., IN16. One of ordinary skill should also appreciate that greater or lesser numbers of array lines per layer may be decoded by the same column decode signal, and greater or lesser numbers of array layers may be decoded by the same column decode signal, as suits the particular design goals and technology choice for a given design.

Figure 10:
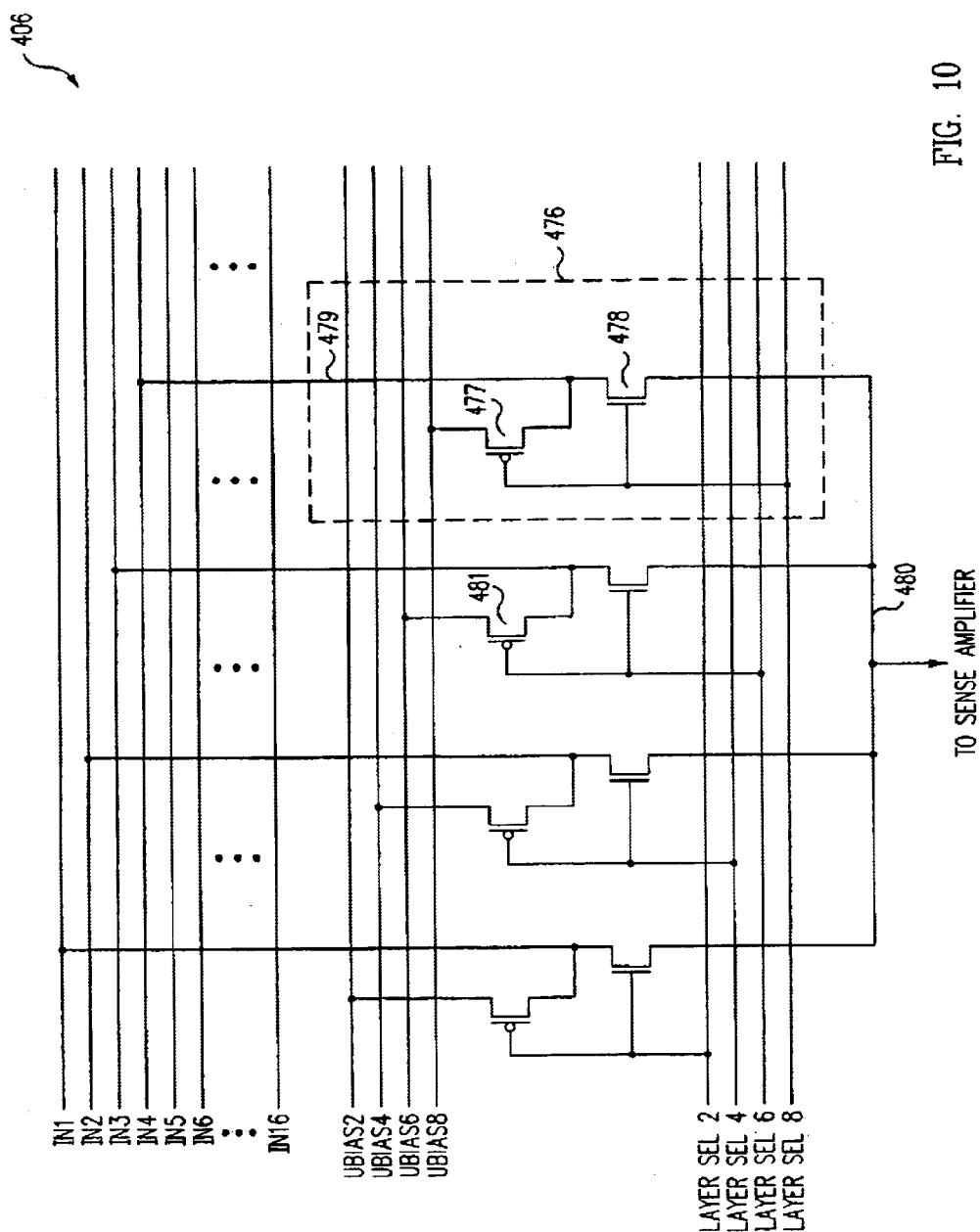
FIG. 10 is an electrical schematic diagram of another portion of a multi-level decoder circuit in accordance with the present invention.

Referring now to FIG. 10, an exemplary layer decoder 406 is depicted. Four of the sixteen intermediate nodes IN1, IN2, ..., IN16 are coupled to input nodes (e.g., node 479) of this decoder 406. Each of these four intermediate nodes preferably corresponds to an array line on a different layer of the memory array. One of these intermediate nodes is selected (corresponding to the selected memory array layer) and is coupled to the output node 480 by way of a selected coupling circuit (e.g., coupling circuit 476), which is then preferably routed to a sense amplifier input as described above. The other three intermediate nodes are respectively coupled to the unselected bias line associated with the layer by a second device (e.g., P-channel transistor 477) within each intermediate node coupling circuit. In this way, the twelve array lines which are selected by the top-level of the tree decoder (of the sixteen total selected array lines) but which are not selected by the second level of the decoder (i.e., the layer decoder) are coupled to the appropriate unselected bias line. Consequently, only the four selected array lines are coupled to its respective sense amplifier, and all the unselected array lines are coupled to the appropriate unselected bias voltage. Of the 512 array lines exiting to the "bottom side" of the array in the exemplary organization depicted in FIG. 8, a total of 496 unselected array lines are biased by the unselected multi headed column decoder circuits (which forms the top-level of the decoder circuit), and 12 of the unselected array lines are biased by the unselected layer decoder circuits. The 4 selected array lines are not biased by the decoder circuits, but are coupled to the sense amplifiers, which may provide whatever bias on the selected array lines is desired or advantageous. In the case of a memory array employing a programmable memory cell technology, programming circuitry may also be connected to the output 480 of the layer decoder 406 to drive a selected array line to a suitable programming bias condition.

Different sense amplifier configurations may be employed as suits the memory cell technology and the array configuration, and the decoder configuration chosen. In the exemplary embodiments described herein, a sense amplifier configuration better optimized for sensing extremely small signals, even at the expense of sensing time, may be preferably employed. Suitable sense amplifier circuits include various clamped bit line sense circuits, and including schemes incorporating noise detection lines, such as those described in U.S. application Ser. No. 09/896,468, entitled "Current Sensing Method and Apparatus Particularly Useful for a Memory Array of Cells Having Diode-Like Characteristics" by Scheuerlein, which is hereby incorporated by reference in their entirety.

In a preferred embodiment, the memory array 120 includes antifuse memory cells, although other types of passive element memory cells are contemplated, as well as certain other types of memory cells, described later.

In an exemplary embodiment of an integrated circuit including a three-dimensional write-once memory array, the memory array is divided into 72 sub-arrays as shown in FIG. 9. Eight error correction check/syndrome bits are concatenated to each 64 bit data word to generate a 72-bit ECC data word. Preferably each bit of this 72-bit ECC data word is written physically into a different corresponding one of the 72 sub-arrays. Additional details of this exemplary embodiment are described in U.S. patent application Ser. No. 20020083390 A1, entitled "Three-Dimensional Memory Array and Method for Storing Data Bits and ECC Bits Therein," mentioned above.

Other numbers of sub-arrays are contemplated for use with an ECC circuit. For example, two bits of each 72-bit ECC word may be stored respectively into each of 36 sub-arrays. In a test mode as described above, 36 sub-arrays may be simultaneously selected, with 16 sense circuits (i.e., Y-lines) simultaneously selected in each sub-array. Other suitable arrangements are numerous, and the particular embodiments described only illustrative of the many ways that the invention may be implemented in an integrated circuit having a plurality of sub-arrays.

As taught by U.S. Pat. No. 6,034,882, each sub-array of an exemplary embodiment preferably includes a row select block on the left side of the sub-array to support half of the word lines (i.e., every other one), and further includes a row select block 184 on the right side of the sub-array to support the remaining half of the word lines. It should be appreciated that the designations top, left, bottom, and right are merely convenient descriptive terms for the four sides of a memory array. Two interdigitated groups of X-lines are oriented horizontally in the array, and two interdigitated groups of Y-lines are oriented vertically in the array. Each respective group of X-lines or Y-lines is preferably served by a respective decoder/driver circuit and a respective sense circuit on one of the four sides of the array. Preferred embodiments for row and column circuitry serving a plurality of memory sub-arrays, which embodiments are useful alone or in combination with any of the preferred embodiments described herein, are set forth in the aforementioned "Memory Device with Row and Column Decoder Circuits Arranged in a Checkerboard Pattern under a Plurality of Memory Arrays," U.S. patent application Ser. No. 09/896,814.

Additional details of bias circuits and layer decoder circuits particularly suitable for a three-dimensional memory array of write-once anti fuse passive element memory cells are described in the aforementioned U.S. application Ser. No. 09/897,771, entitled "Method and Apparatus for Biasing Selected and Unselected Array Lines When Writing a Memory Array", and in the aforementioned "Three-Dimensional Memory Array Incorporating Serial Chain Diode Stack," U.S. patent application Ser. No. 09/897,705.

As used herein, a passive element memory array includes a plurality of 2-terminal memory cells, each connected between an associated X-line and an associated Y-line. Such a memory array may be planar or may be a three-dimensional array having more than one plane of memory cells. Each such memory cell has a non linear conductivity in which the current in a reverse direction (i.e., from cathode to anode) is lower than the current in a forward direction. Application of a voltage from anode to cathode greater than a programming level changes the conductivity of the memory cell. The conductivity may decrease when the memory cell incorporates a fuse technology, or may increase when the memory cell incorporates an antifuse technology. A passive element memory array is not necessarily a one-time programmable (i.e., write once) memory array.

Word lines may also be referred to as row lines or X-lines, and bit lines may also be referred to as column lines or Y-lines. The distinction between "word" lines and "bit" lines may carry at least two different connotations to those skilled in the art. When reading a memory array, it is assumed by some practitioners that word lines are "driven" and bit lines are "sensed." In this regard, X-lines (or word lines) are frequently, but not always, connected to the anode terminal of the memory cells, and Y-lines (or bit lines) are frequently, but not always, connected to the cathode terminal of the memory cells. Secondly, the memory organization (e.g., data bus width, number of bits simultaneously read during an operation, etc.) may have some association with viewing one set of the two array lines more aligned with data "bits" rather than data "words."

As used herein, word lines and bit lines represent orthogonal array lines, and follow the common assumption in the art that word lines are driven and bit lines are sensed. Thus, bit lines of an array may also be referred to as sense lines of the array, and may also be referred to as simply array lines (i.e., even though other array lines also exist). No particular implication should be drawn as to word organization by use of such terms.

The embodiments described may show or imply a selected word line being driven to a voltage and a selected bit line being sensed, and may show or imply memory cell anode terminals connected to word lines and cathode terminals connected to bit lines, but other embodiments are specifically contemplated. For example, in a multi level memory array, an adjacent memory plane may be connected similarly (e.g., a back-to-back diode stack memory array), or may reverse the directionality of memory cells in the adjacent plane (e.g., a serial chain diode stack memory array) so that the anode terminals are connected to bit lines and the cathode terminals to word lines. Consequently, the designations herein of X-lines, word lines, and row lines, and of Y-lines, bit lines, and column lines are illustrative of the various embodiments but should not be viewed in a restrictive sense, but rather a more general sense. For example, the sensing circuits described herein may be coupled to word lines rather than bit lines, or may be used for both word lines and bit lines, when sensing a current in a word line rather than in a bit line. Such organizations (and others) are described in the aforementioned "Three-Dimensional Memory Array Incorporating Serial Chain Diode Stack" by Kleveland, et al, U.S. patent application Ser. No. 09/897, 705.

The directionality of various array lines in the various figures is merely convenient for ease of description of the two groups of crossing lines in the array. While X-lines are usually orthogonal to Y-lines, such is not necessarily implied by such terminology. Moreover, the word and bit organization of a memory array may also be easily reversed, having Y-lines organized as word lines and X-lines organized as bit lines. As an additional example, portions of an array may correspond to different output bits of a given word. Such various array organizations and configurations are well known in the art, and the invention in intended to comprehend a wide variety of such variations.

As used herein, a tree decoder circuit utilizes at least two levels of decoding for array lines within a single sub-array within an integrated circuit. In some embodiments there may be additional sub-arrays present, and additional levels of decoding may be employed to further decode and route signals from some or all sub-arrays to a desired destination, either on-chip or off-chip. As used herein, an integrated circuit having a three-dimensional memory array is assumed to be a monolithic integrated circuit, rather than an assembly of more than one monolithic integrated circuit.

The block diagrams herein may be described using the terminology of a single node connecting the blocks. Nonetheless, it should be appreciated that, when required by the context, such a "node" may actually represent a pair of nodes for conveying a differential signal, or may represent multiple separate wires (e.g., a bus) for carrying several related signals or for carrying a plurality of signals forming a digital word or other multi-bit signal.

It will be appreciated by one skilled in the art that any of several expressions may be equally well used when describing the operation of a circuit including the various signals and nodes within the circuit, and no subtle inferences should be read into varied usage within this description. A logic signal has an active level (i.e., active state) and an inactive level (at least for traditional binary logic signals). The active level for some logic signals is a high level (i.e., an "active-high" signal) and for others is a low level (i.e., an "active-low" signal). A logic signal is "asserted" or "activated" when driven to its active level. Conversely, a logic signal is "de-asserted" or "de-activated" when driven to its inactive level. A high logic level is frequently referred to as a logic "1" and a low logic level is frequently referred to as a logic "0" (at least for positive logic). Frequently logic signals are named in a fashion to convey which level is the active level. The schematic diagrams and accompanying description of the signals and nodes should in context be clear.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Nonetheless, in the interest of clarity, not all of the routine features of the implementations described herein are shown and described. It should, of course, be appreciated that in the development of any such actual implementation, numerous implementation specific decisions must be made in order to achieve the developer's specific goals, such as compliance with application and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

For example, decisions as to the number of memory cells within each array or sub-array, the particular configuration chosen for word line and bit line pre-decoder and decoder circuits and bit line sensing circuits, as well as the word organization, are all believed to be typical of the engineering decisions faced by one skilled in the art in practicing this invention in the context of developing a commercially-viable product. Nonetheless, even though a mere routine exercise of engineering effort is believed to be required to practice this invention, such engineering efforts may result in additional inventive efforts, as frequently occurs in the development of demanding, competitive products.

The present invention is contemplated for advantageous use with any of a wide variety of memory cell technologies and memory array configurations, including both traditional single-level memory arrays and multi-level (i.e., three-dimensional) memory arrays, and particularly those having extremely dense X-line or Y-line pitch requirements. The memory cells may be comprised of semiconductor materials, as described in U.S. Pat. No. 6,034,882 to Johnson et al., U.S. Pat. No. 5,835,396 to Zhang, and the aforementioned U.S. patent application Ser. No. 09/560,626 to Knall. In certain embodiments an antifuse memory cell is contemplated. Other types of memory arrays, such as MRAM and organic passive element arrays, can also be used. MRAM (magnetoresistive random access memory) is based on magnetic memory elements; such as a magnetic tunnel junction (MTJ). MRAM technology is described in "A 2556 kb 3.0V ITIMTJ Nonvolatile Magnetoresistive RAM" by Peter K. Naji et al., published in the Digest of Technical Papers of the 2001 IEEE International Solid-State Circuits Conference, ISSCC 2001/Session 7/Technology Directions: Advanced Technologies/7.6, Feb. 6, 2001 and pages 94–95, 404–405 of ISSCC 2001 Visual Supplement. Certain passive element memory cells may be used which incorporate layers of organic materials including at least one layer that has a diode-like characteristic conduction and at least one organic material that changes conductivity with the application of an electric field. U.S. Pat. No. 6,055,180 to Gudensen et al. describes such organic passive element arrays. Memory cells comprising materials such as phase-change materials and amorphous solids can also be used. See U.S. Pat. No. 5,751,012 to Wolstenholme et al. and U.S. Pat. No. 4,646,266 to Ovshinsky et al. In other embodiments, three-terminal memory cells may also be employed, rather than two-terminal passive element memory cells, and multiple X-lines (or row lines) selected to sum currents from more than one memory cell on a selected Y-line (or bit line). Such memory cells include flash EPROM and EEPROM cells, which are well known in the art. Moreover, other memory array configurations having extremely dense X-line and/or Y-line pitch requirements are also contemplated such as, for example, those incorporating thin-film transistor (TFT) EEPROM memory cells, as described in "Dense Arrays and Charge Storage Devices, and Methods for Making Same," by Thomas H. Lee, et al., U.S. application Ser. No. 09/927,648, filed Aug. 13, 2001, which application is hereby incorporated by reference.

While circuits and physical structures are generally presumed, it is well recognized that in modern semiconductor design and fabrication, physical structures and circuits may be embodied in computer readable descriptive form suitable for use in subsequent design, test or fabrication stages as well as in resultant fabricated semiconductor integrated circuits. Accordingly, claims directed to traditional circuits or structures may, consistent with particular language thereof, read upon computer readable encodings and representations of same, whether embodied in media or combined with suitable reader facilities to allow fabrication, test, or design refinement of the corresponding circuits and/or structures. The invention is contemplated to include circuits, related methods, and computer-readable medium encodings of such circuits and methods, all as described herein, and as defined in the appended claims. As used herein, a computer-readable medium includes at least disk, tape, or other magnetic, optical, semiconductor (e.g., flash memory cards, ROM), or electronic medium and a network, wireline, wireless or other communications medium. An encoding of a circuit may include circuit schematic information, physical layout information, behavioral simulation information, and/or may include any other encoding from which the circuit may be represented or communicated.

The foregoing details description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention. In particular, even though the preferred embodiments are described in the context of a passive element memory array, the teachings of the present invention are believed advantageous for use with other types of memory cells, such as certain 3-terminal memory cells. While certain embodiments have been described in the context of a three-dimensional, field-programmable, write once memory array, it should be appreciated that such an array is not necessarily required. Moreover, the embodiments described above are specifically contemplated to be used alone as well as in various combinations. Accordingly, other embodiments, variations, and improvements not described herein are not necessarily excluded from the scope of the invention.

What is claimed is:

1. An integrated circuit comprising:
   a memory sub-array having a plurality of array lines on at least one layer of the memory sub-array, at least some of the array lines exiting to one side of the memory sub-array;
   a tree decoder circuit associated with the memory sub-array, said tree decoder circuit comprising a top level responsive to a plurality of top-level control signals, and comprising at least a second level responsive to a plurality of second-level control signals, and further comprising a plurality of intermediate nodes between the top-level and second level each extending along the one side of the sub-array;
   wherein each of the plurality of top-level control signals has a range of control which is substantially less than the extent of each intermediate node.

2. The integrated circuit as recited in claim 1 wherein the memory sub-array comprises a three-dimensional memory sub-array comprising at least two layers of array lines having at least some array lines exiting to the one side of the memory sub-array.

3. The integrated circuit as recited in claim 1 wherein each of the plurality of top-level signals selects a respective group of array lines, each respective array line of a group being coupled to a respective one of the plurality of intermediate nodes.

4. The integrated circuit as recited in claim 3 wherein unselected top-level signals couple each respective array line of an unselected group to an associated unselected bias node.

5. The integrated circuit as recited in claim 4 further comprising at least one unselected array line bias circuit for respectively generating an unselected bias voltage on at least one unselected bias node.

6. The integrated circuit as recited in claim 3 wherein each respective group comprises a contiguous block of array lines of those exiting to the one side.

7. The integrated circuit as recited in claim 1 wherein the extent of each intermediate node is at least half the distance along the one side of the sub-array.

8. The integrated circuit as recited in claim 3 wherein each of the plurality of second-level signals selects a respective group of at least one of the plurality of intermediate nodes and, when unselected, couples its respective intermediate node to an associated unselected bias node, thereby coupling array lines that are coupled to the respective intermediate node a selected top-level signal, to the associated unselected bias node.

9. The integrated circuit as recited in claim 1 wherein the plurality of array lines on at least one layer of the memory sub-array includes array lines which exit to the side opposite the one side of the memory array.

10. The integrated circuit as recited in claim 1 wherein each selected intermediate node is coupled to an associated sense amplifier input node.

11. An integrated circuit comprising:
   a memory sub-array comprising a plurality of array lines on at least one layer of the memory sub-array having at least some of the array lines exiting to one side of the memory sub-array;
   a tree decoder circuit associated with the memory sub-array, said tree decoder comprising
      a first plurality of selection circuits, each responsive to an associated one of a first plurality of decode signals, for coupling, when selected, a respective array line to an associated one of a plurality of intermediate nodes of the tree decoder, said intermediate nodes each having a respective extent along the one side of the sub-array;
      a second plurality of selection circuits, each responsive to an associated one of a second plurality of decode signals, for coupling, when selected, a respective intermediate node to an associated other node of the tree decoder;
   wherein each of the first plurality of decode signals has a range of control that extends a distance along the one side of the sub-array which is substantially less than the extent of the intermediate nodes.

12. The integrated circuit as recited in claim 11 wherein the memory sub-array comprises a three-dimensional memory sub-array comprising at least two layers of array lines having at least some array lines exiting to the one side of the memory sub-array.

13. The integrated circuit as recited in claim 12 wherein each respective one of the first plurality of decode signals selects a respective group of at least two array lines on each of at least two layers of the memory sub-array.

14. The integrated circuit as recited in claim 13 wherein each of the first plurality of selection circuits is configured to couple, when unselected, its associated array line to an associated unselected bias node for the respective sub-array layer.

15. The integrated circuit as recited in claim 13 wherein each respective group comprises a contiguous block of array lines of those exiting to the one side.

16. The integrated circuit as recited in claim 15 wherein said contiguous block comprises at least two adjacent array lines of those exiting the one side of the memory sub-array on each of at least two layers.

17. The integrated circuit as recited in claim 1 wherein each of the first plurality of selection circuits is configured to couple, when unselected, its associated array line to an associated unselected bias node.

18. The integrated circuit as recited in claim 17 further comprising at least one unselected array line bias circuit for respectively generating an unselected bias voltage on at least one unselected bias node.

19. The integrated circuit as recited in claim 17 wherein each of the second plurality of selection circuits is configured to couple, when unselected, its respective intermediate node to an associated unselected bias node, thereby coupling array lines that are coupled to the respective intermediate node by selected array line coupling circuits, to the associated unselected bias node.

20. The integrated circuit as recited in claim 11 wherein the plurality of array lines on at least one layer of the memory sub-array includes array lines which exit to the side opposite the one side of the memory array.

21. The integrated circuit as recited in claim 11 wherein each intermediate node coupling circuit is configured to couple, when selected, its respective intermediate node to an associated sense amplifier input node.

22. The integrated circuit as recited in claim 11 wherein:
the memory sub-array is disposed above a semiconductor substrate of the integrated circuit; and
each of the first plurality of decode signals is generated by a decoder circuit disposed at least partially beneath the memory array.

23. An integrated circuit comprising:
a memory sub-array having a plurality of array lines on at least one layer of the memory sub-array, at least some of the array lines exiting to one side of the memory sub-array;
a first decoder circuit responsive at least to address signals, for generating a first plurality of decode signals, and for generating a second plurality of decode signals;
a first plurality of array line coupling circuits, each responsive to an associated one of the first plurality of decode signals, for coupling, when selected, a respective array line to an associated one of a plurality of intermediate nodes, said intermediate nodes each having a respective extent along the one side of the sub-array;
a first plurality of intermediate node coupling circuits, each responsive to an associated one of the second plurality of decode signals, for coupling, when selected, a respective intermediate node to an associated other node;
wherein each of the first plurality of decode signals is associated with a respective group of the array line coupling circuits, each respective array line coupling circuit within a given group for coupling, when selected, a respective array line to a respective intermediate node;
wherein each of the first plurality of decode signals has a range of control that extends a distance along the one side of the sub-array which is substantially less than the extent of the intermediate nodes.

24. The integrated circuit as recited in claim 23 wherein the memory sub-array comprises a three-dimensional memory sub-array comprising at least two layers of array lines having at least some array lines exiting to the one side of the memory sub-array.

25. The integrated circuit as recited in claim 24 wherein each respective group of array lines associated with a respective one of the first plurality of decode signals includes at least two array lines on each of at least two layers of the memory sub-array.

26. The integrated circuit as recited in claim 25 wherein each array line coupling circuit is configured to couple, when unselected, its associated array line to an associated unselected bias node for the respective sub-array layer.

27. The integrated circuit as recited in claim 26 further comprising a plurality of unselected array line bias circuits, each associated with a respective layer of the memory array, each for generating a respective unselected bias voltage on a respective unselected bias node for the respective sub-array layer.

28. The integrated circuit as recited in claim 25 wherein each respective group comprises a contiguous block of array lines of those exiting to the one side.

29. The integrated circuit as recited in claim 23 wherein the extent of each intermediate node is at least half the distance along the one side of the sub-array.

30. The integrated circuit as recited in claim 23 wherein each array line coupling circuit is configured to couple, when unselected, its respective array line to an associated unselected bias node.

31. The integrated circuit as recited in claim 30 further comprising at least one unselected array line bias circuit for respectively generating an unselected bias voltage on at least one unselected bias node.

32. The integrated circuit as recited in claim 30 wherein each intermediate node coupling circuit is configured to couple, when unselected, its respective intermediate node to an associated unselected bias node, thereby coupling array lines that are coupled to the respective intermediate node by selected array line coupling circuits, to the associated unselected bias node.

33. The integrated circuit as recited in claim 23 wherein the plurality of array lines on at least one layer of the memory sub-array includes array lines which exit to the side opposite the one side of the memory array.

34. The integrated circuit as recited in claim 23 wherein each intermediate node coupling circuit is configured to couple, when selected, its respective intermediate node to an associated sense amplifier input node.

35. The integrated circuit as recited in claim 30 wherein each of the plurality of array line coupling circuits comprises:
a first transistor device for coupling the respective array line to the associated intermediate node; and
a second transistor device for coupling the respective array line to the associated unselected bias node.

36. The integrated circuit as recited in claim 35 wherein each of the plurality of intermediate node coupling circuits comprises:
a first transistor device for coupling the respective intermediate node to an associated decoder output node; and
a second transistor device for coupling the respective intermediate node to the associated unselected bias node, thereby coupling array lines coupled thereto by selected array line coupling circuits, to the associated unselected bias node.

37. The integrated circuit as recited in claim 23 wherein:
each of the first plurality of decode nodes is routed into the first plurality of array line coupling circuits from a side thereof opposite the memory sub-array.

38. The integrated circuit as recited in claim 23 wherein:
- the memory sub-array is disposed above a semiconductor substrate of the integrated circuit; and
- the first decoder circuit is disposed in the semiconductor substrate at least partially beneath the memory sub-array.

39. An integrated circuit comprising:
- a three-dimensional memory array having a respective plurality of array lines for at least two respective memory array layers exiting to one side of the memory array;
- means for simultaneously coupling, in response to a single selected decode node, at least two array lines exiting to the one side of the memory array, on each of at least two memory array layers, to respective intermediate nodes.

40. The integrated circuit as recited in claim 39 wherein the means for simultaneously coupling comprises:
- means for simultaneously coupling, in response to a single decode node when unselected, at least two adjacent array lines exiting to the one side of the memory array, on each of at least two memory array layers, to a respective unselected bias potential for the respective layer.

41. The integrated circuit as recited in claim 39 wherein the means for simultaneously coupling comprises:
- a plurality of multi-headed decoder circuits, each comprising a respective plurality of array line coupling circuits responsive to a respective one of a plurality of decode nodes.

* * * * *

UNITED STATES PATENT AND TRADEMARK OFFICE
CERTIFICATE OF CORRECTION

PATENT NO. : 6,859,410 B2
DATED : February 22, 2005
INVENTOR(S) : Roy E. Scheuerlein and Matthew P. Crowley It is certified that error appears in the above-identified patent and that said Letters Patent is hereby corrected as shown below:

Column 8,
Line 65, the phrase "multi headed" should read -- multi-headed --.

Column 9,
Line 18, the word "Scheucrlein" should read -- Scheuerlein --.

Column 17,
Line 3, the number "1" should read -- 11 --.

Signed and Sealed this

Thirty-first Day of May, 2005

JON W. DUDAS
*Director of the United States Patent and Trademark Office*